US010793421B2

(12) United States Patent
Rajasekaran et al.

(10) Patent No.: US 10,793,421 B2
(45) Date of Patent: Oct. 6, 2020

(54) WAFER LEVEL ENCAPSULATION FOR MEMS DEVICE

(71) Applicant: VANGUARD INTERNATIONAL SEMICONDUCTOR SINGAPORE PTE. LTD., Singapore (SG)

(72) Inventors: Natarajan Rajasekaran, Singapore (SG); Siddharth Chakravarty, New York, NY (US); Yu Ting Ng, Singapore (SG); Rakesh Kumar, Singapore (SG); Pradeep Yelehanka, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 14 days.

(21) Appl. No.: 15/810,156

(22) Filed: Nov. 13, 2017

(65) Prior Publication Data
US 2019/0144269 A1    May 16, 2019

(51) Int. Cl.
*B81B 7/00* (2006.01)
*H01L 21/67* (2006.01)
*B81C 1/00* (2006.01)
*B81B 7/04* (2006.01)

(52) U.S. Cl.
CPC .............. *B81B 7/0077* (2013.01); *B81B 7/04* (2013.01); *B81C 1/00269* (2013.01); *B81C 1/00301* (2013.01); *H01L 21/67* (2013.01); *B81B 2207/095* (2013.01); *B81C 2203/0118* (2013.01)

(58) Field of Classification Search
CPC ....... B81B 7/0032–0077; B81B 2207/09–098; B81C 1/0015; B81C 1/00269; B81C 3/001; B81C 2203/0118; B81C 1/00261–00333; B81C 2203/01–019
See application file for complete search history.

(56) References Cited

U.S. PATENT DOCUMENTS

| | | | |
|---|---|---|---|
| 4,597,164 A * | 7/1986 | Havemann | H01L 21/76224 148/DIG. 82 |
| 5,095,752 A * | 3/1992 | Suzuki | G01P 15/0802 361/280 |
| 5,551,294 A | 9/1996 | Hermann | |
| 6,610,582 B1 | 8/2003 | Stewart | |
| 6,743,656 B2 | 6/2004 | Orcutt et al. | |
| 7,372,074 B2 | 5/2008 | Milne et al. | |
| 8,084,332 B2 | 12/2011 | Nasiri et al. | |

(Continued)

OTHER PUBLICATIONS

Niels Quack et al., Wafer Level AlGe Eutectic Bonding for MEMS-Electronic-Photonic Heterogeneous Integration, International Nano-Optoelectronics Workshop, Aug. 7-15 2012, US.

(Continued)

*Primary Examiner* — Bryan R Junge
(74) *Attorney, Agent, or Firm* — Winston Hsu

(57) ABSTRACT

A microelectromechanical system (MEMS) device is disclosed. The MEMS device includes a device substrate having a MEMS component in a device region. A top cap is fusion bonded to the top surface of the device substrate and a bottom cap is fusion bonded to the bottom surface of the device substrate. The top and bottom caps encapsulate the MEMS components. A cap includes a via isolation which extends a thickness of the cap and surrounds the device region.

12 Claims, 15 Drawing Sheets

(56) References Cited

U.S. PATENT DOCUMENTS

| | | |
|---|---|---|
| 8,507,913 B2 | 8/2013 | Nunan et al. |
| 8,587,077 B2 | 11/2013 | Chen |
| 9,778,039 B2 | 10/2017 | Najafi et al. |
| 9,938,134 B2 | 4/2018 | Lin et al. |
| 2005/0166677 A1* | 8/2005 | Nasiri .................. B81C 1/0023 73/514.16 |
| 2008/0290490 A1* | 11/2008 | Fujii ...................... B81B 7/007 257/684 |
| 2009/0297770 A1* | 12/2009 | Yoshida .............. B81C 1/00269 428/138 |
| 2010/0218977 A1* | 9/2010 | Inoue ..................... B32B 37/12 174/250 |
| 2011/0147859 A1* | 6/2011 | Tanaka ................... B81B 7/007 257/415 |
| 2012/0025199 A1 | 2/2012 | Chen et al. |
| 2012/0142144 A1 | 6/2012 | Taheri |
| 2012/0199920 A1* | 8/2012 | Zhang .................. B81B 7/0077 257/415 |
| 2013/0161820 A1 | 6/2013 | Gonsk et al. |
| 2013/0193527 A1 | 8/2013 | Chu et al. |
| 2013/0203199 A1 | 8/2013 | Huang et al. |
| 2013/0277777 A1 | 10/2013 | Chang et al. |
| 2013/0299924 A1* | 11/2013 | Weber .................. B81B 3/0021 257/415 |
| 2014/0264648 A1 | 9/2014 | Chu et al. |
| 2015/0191345 A1* | 7/2015 | Boysel ................... B81B 7/007 257/774 |
| 2015/0375995 A1 | 12/2015 | Steimle et al. |

OTHER PUBLICATIONS

Vivek Chidambaram et al., Development of CMOS Compatible Bonding Material and Process for Wafer Level MEMS Packaging Application under Harsh Environment, 2012 International Conference on Solid-State and Integrated Circuit(ICSIC 2012), Mar. 17, 2012, Singapore.

Filip Crnogorac et al., Aluminum-Germanium Eutectic Bonding for 3D Integration, 2009 IEEE International Conference on 3D System Integration, 2009, pp. 1-5, IEEE.

* cited by examiner

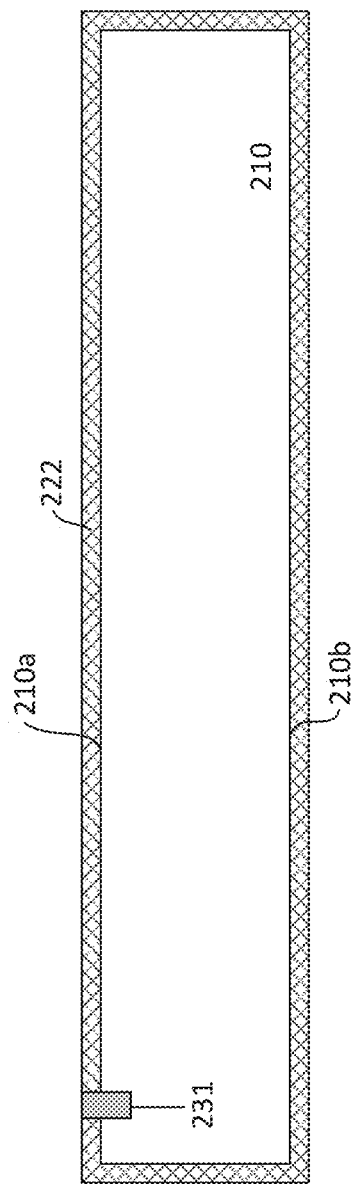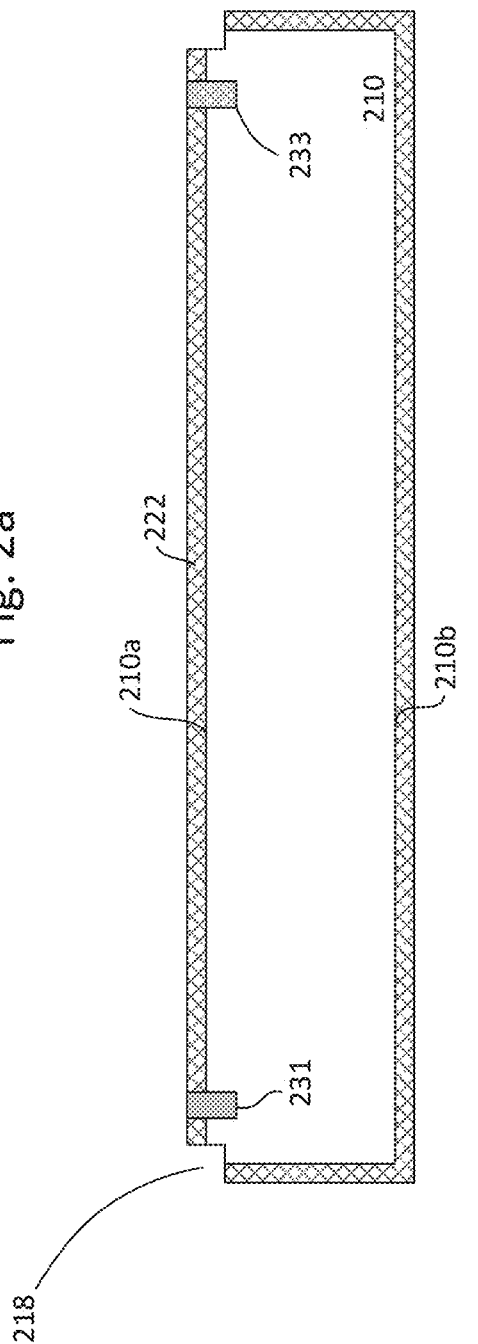

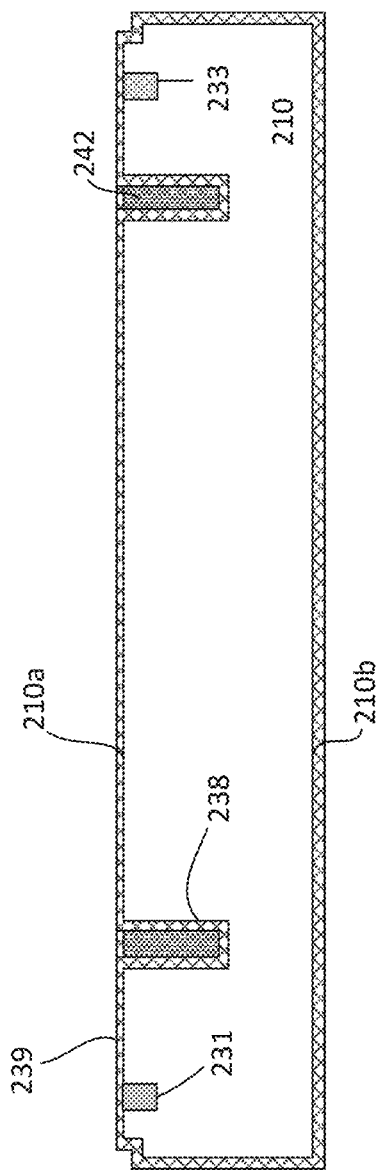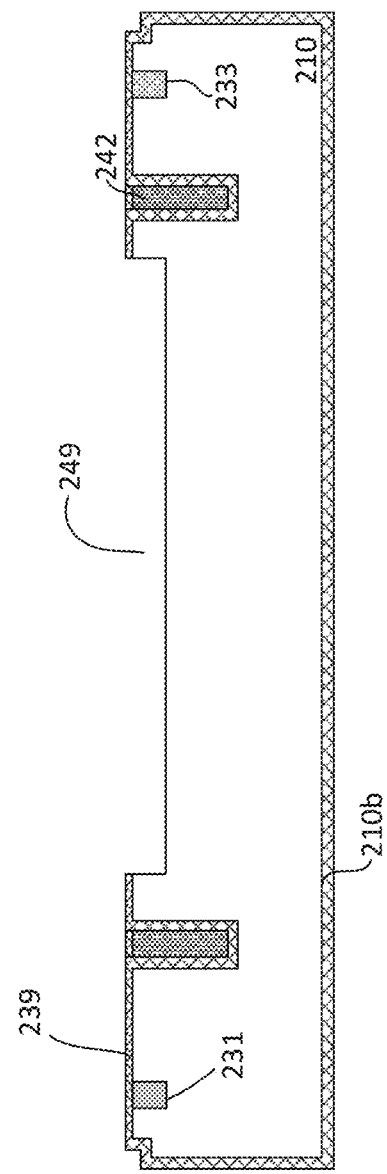
Fig. 2e
Fig. 2f

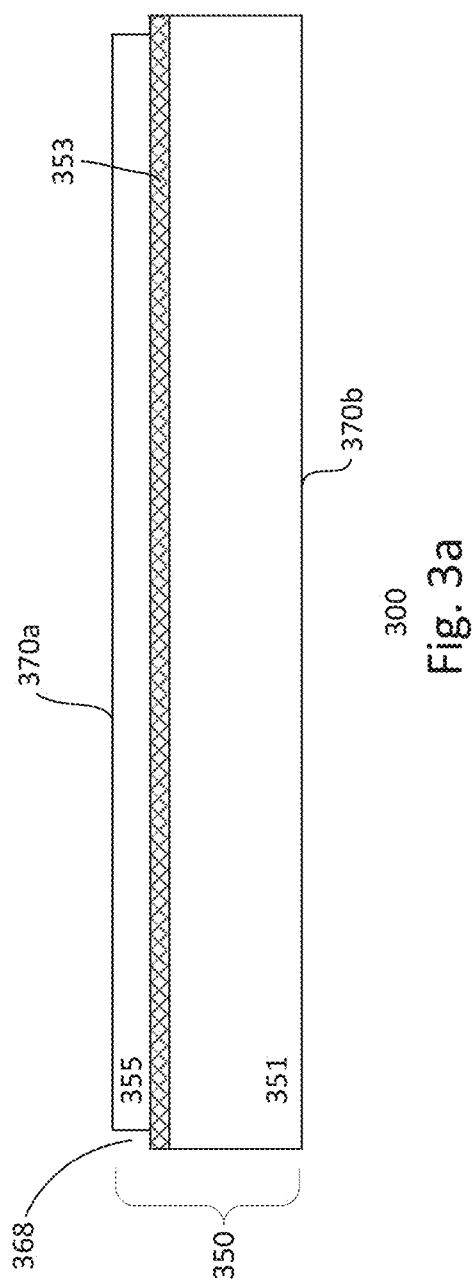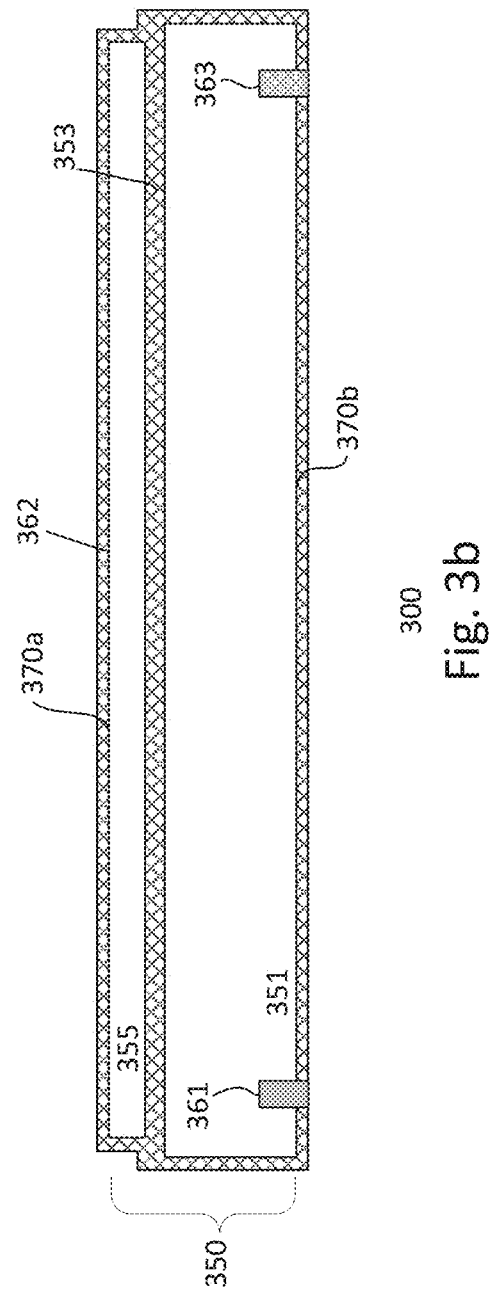

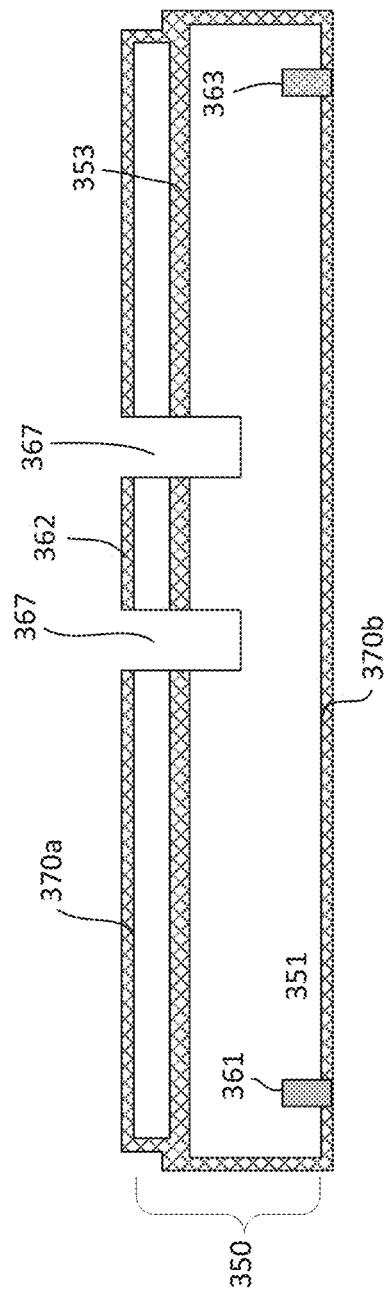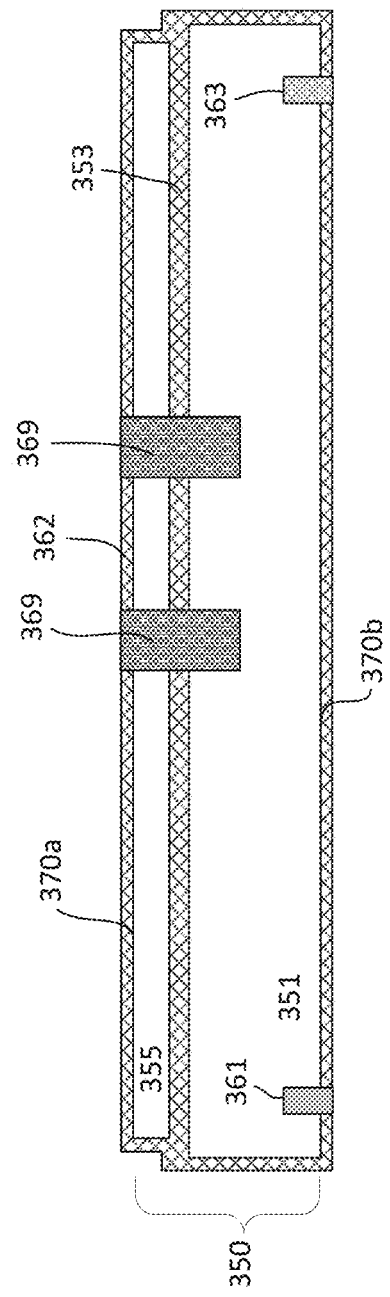

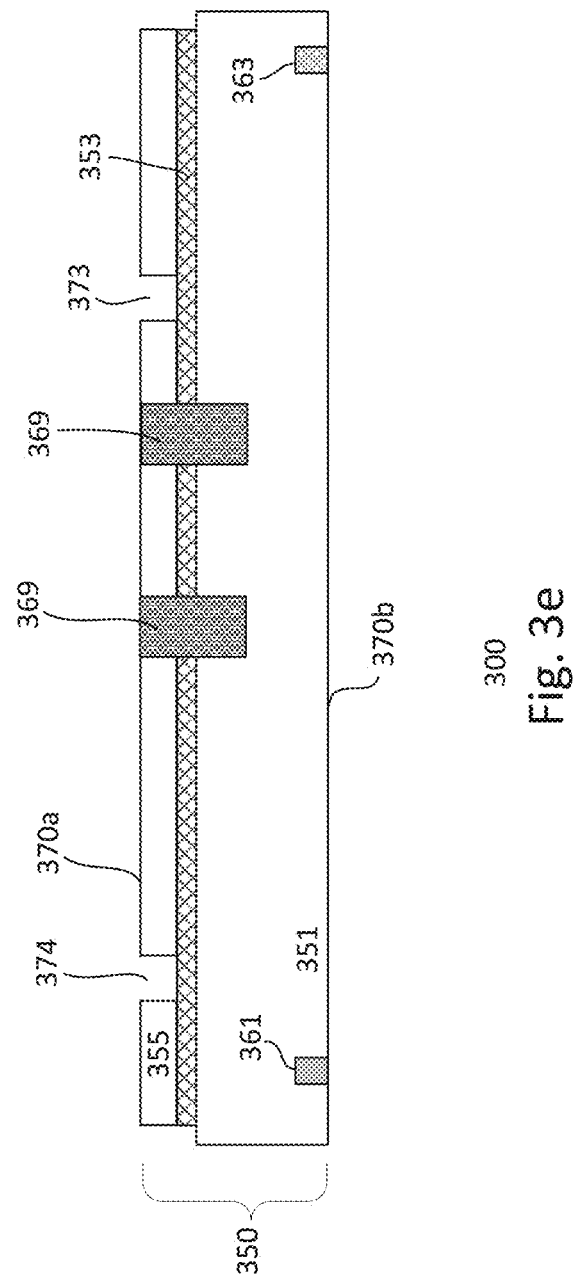

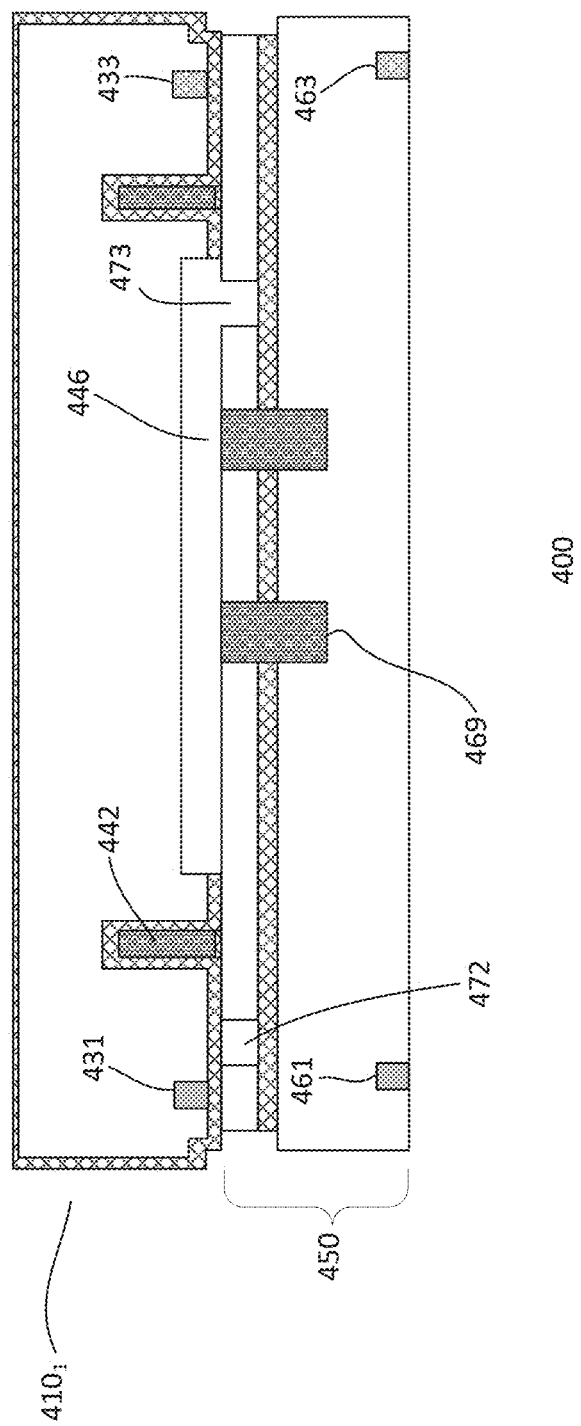

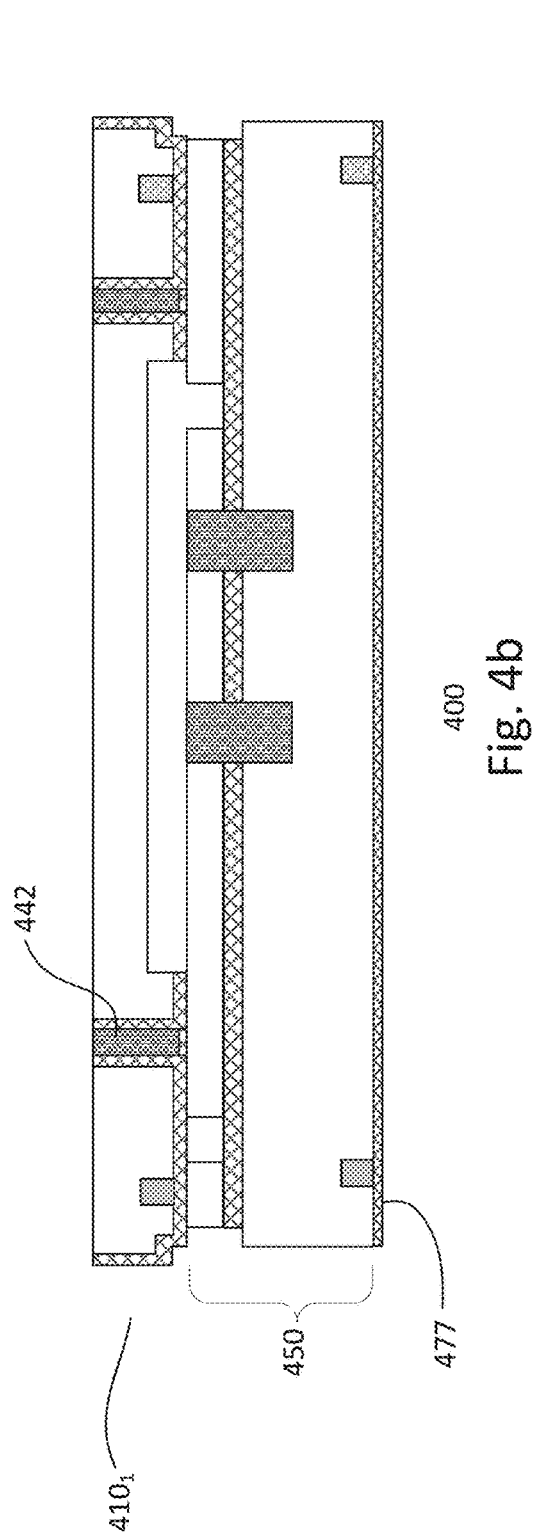
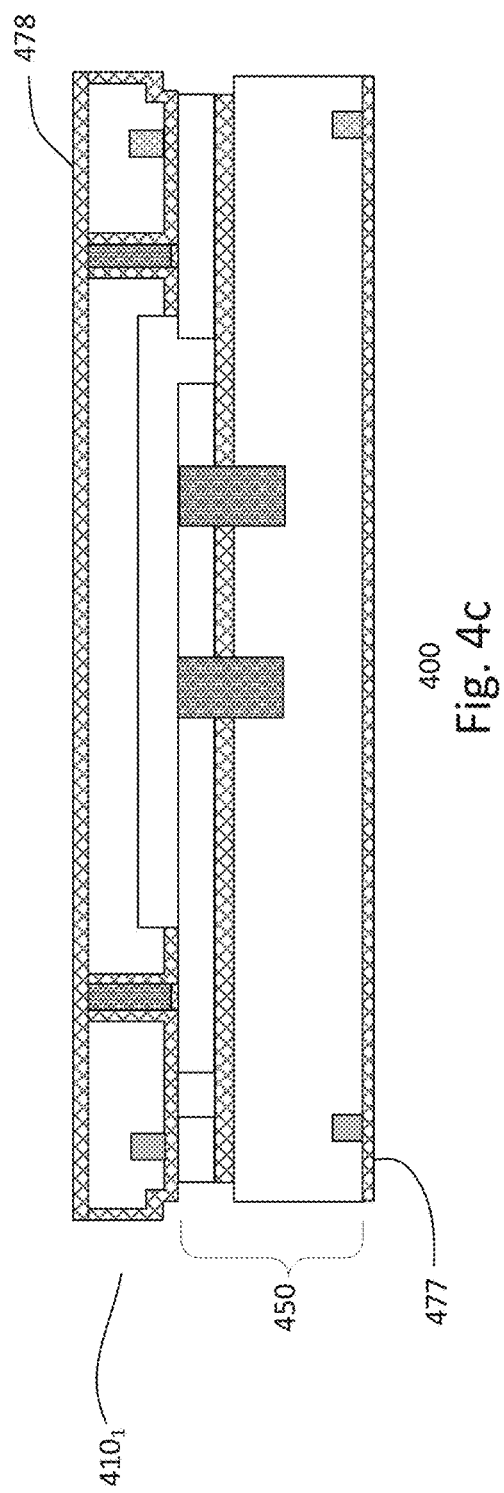

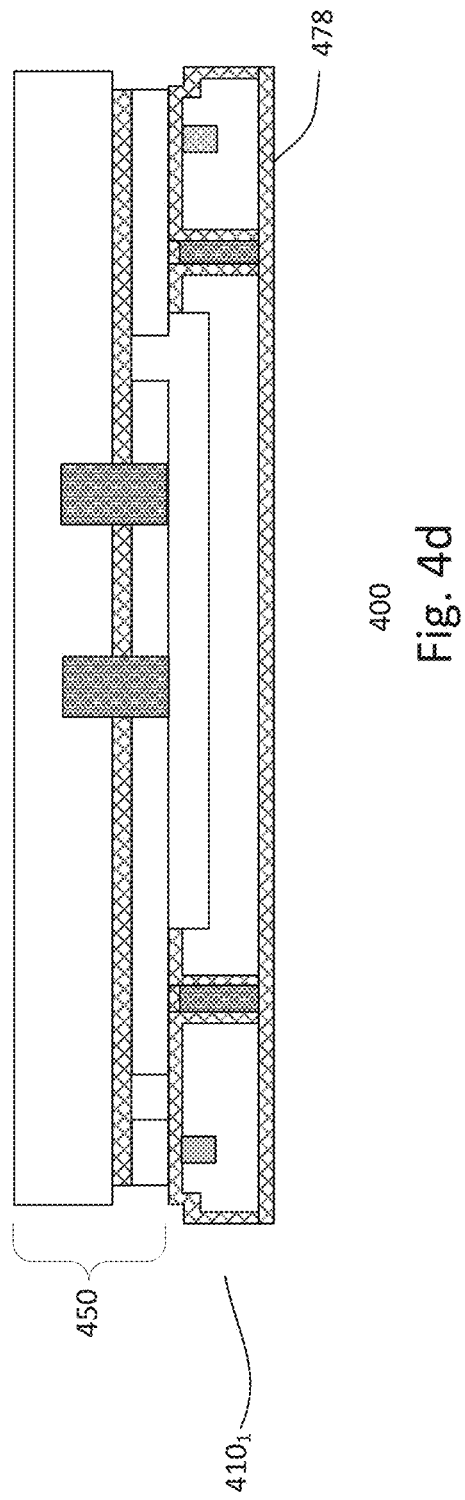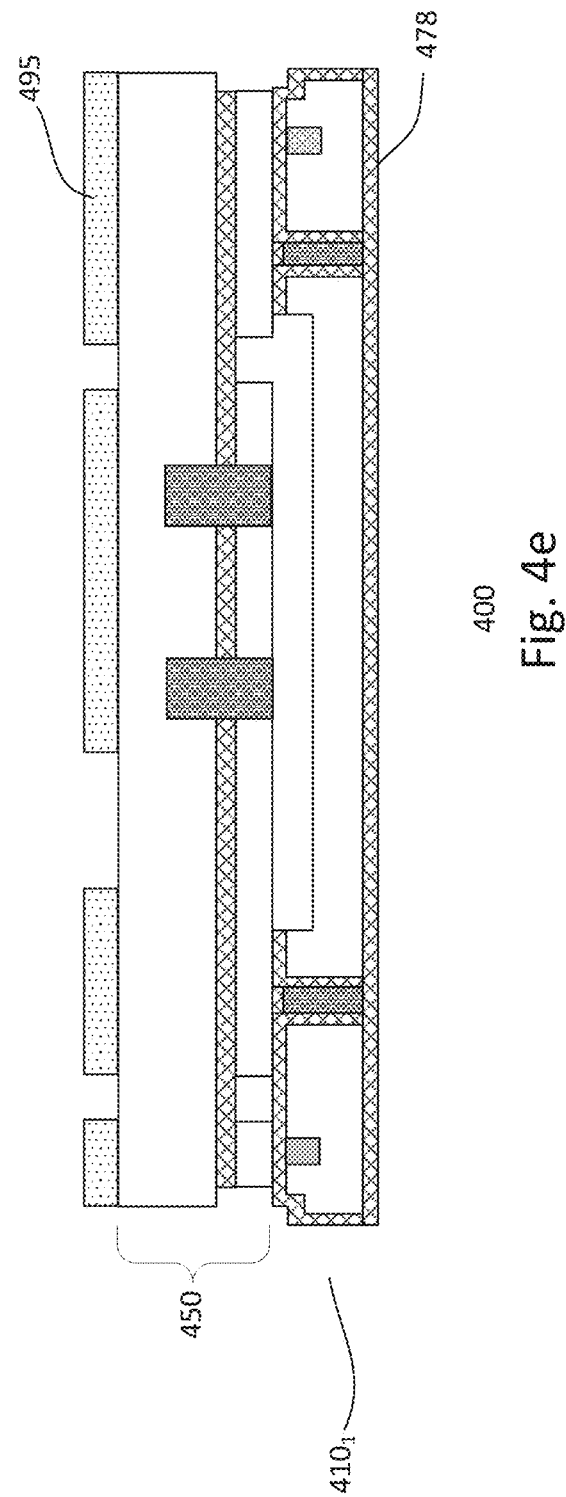

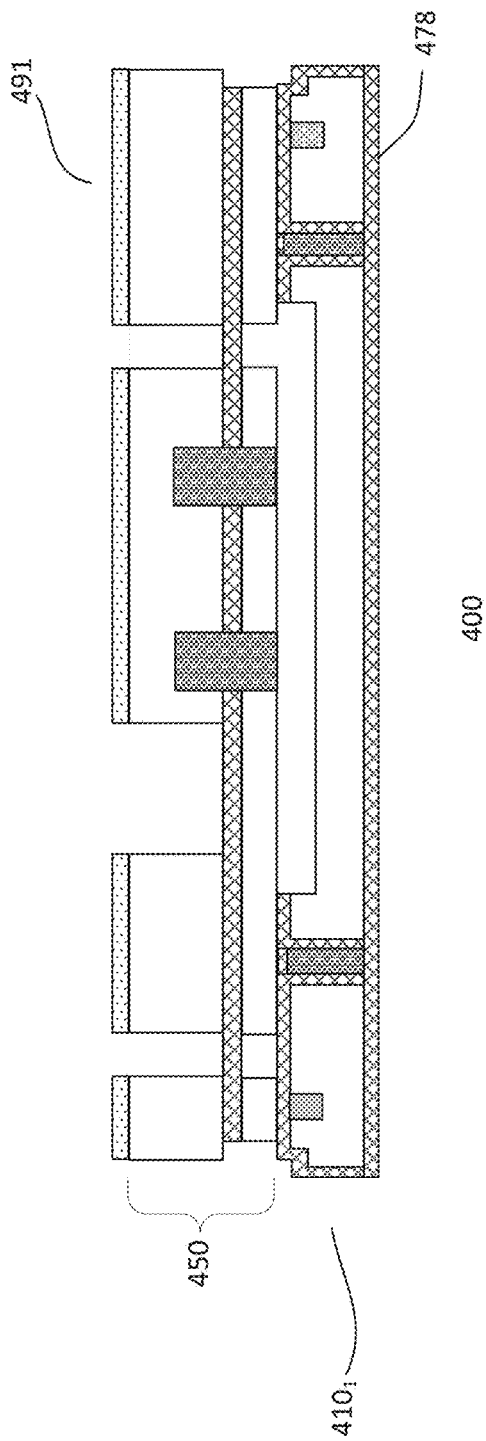
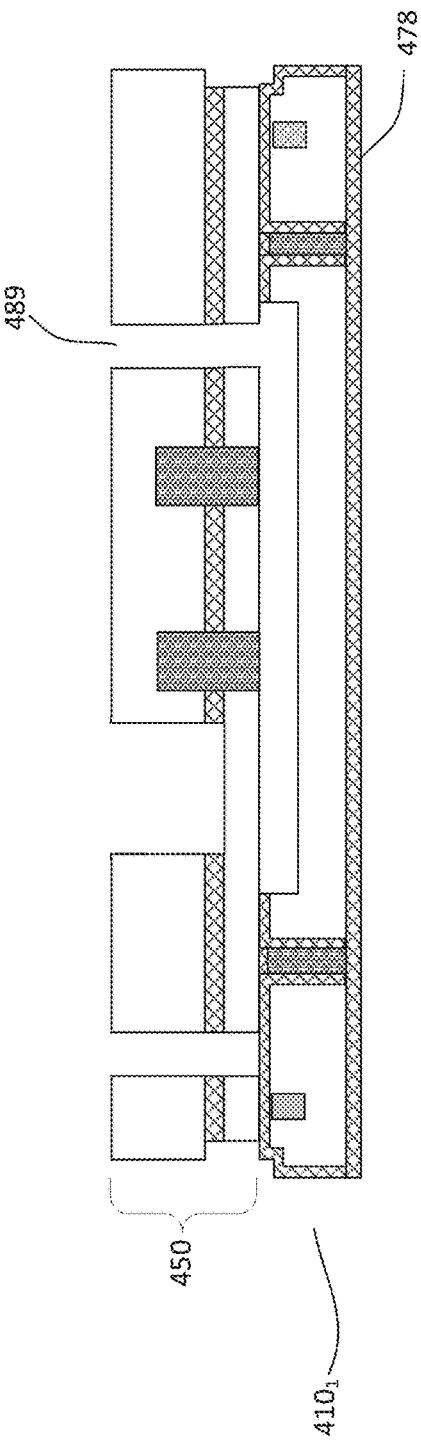

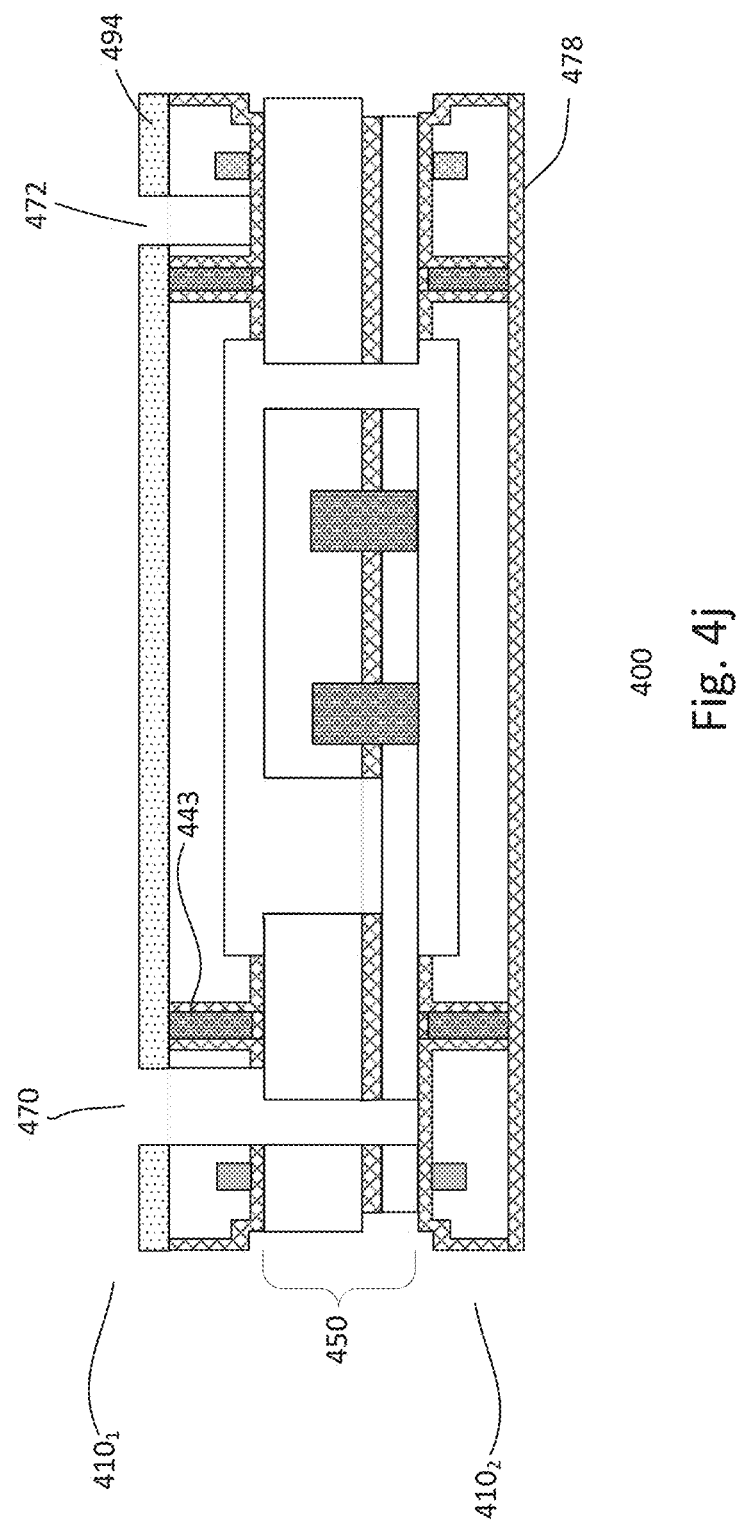

WAFER LEVEL ENCAPSULATION FOR MEMS DEVICE

BACKGROUND

Recent innovations in three-dimensional (3D) chip, die and wafer integration (hereinafter, collectively, stacked structures) have enabled a greater miniaturization of devices as well as technological advancements in increased speed and density, coupled with reduced power consumption and cost. Wafer encapsulation relates to packaging technology on a wafer-level which allows for vertical stacking of two or more wafers and to provide electrical connection and hermetical sealing between the wafers.

Various wafer bonding techniques have been developed and employed to join at least two wafers of the same or different types. However, conventional bonding techniques tend to lead to leakages as well as parasitic buildup.

From the foregoing discussion, it is desirable to provide a wafer level encapsulation for microelectromechanical system (MEMS) device with multi-level electrical contacts and isolation trenches for parasitic reduction and improved leakage.

SUMMARY

Embodiments generally relate to wafer encapsulation and processes for encapsulating MEMS devices. In one aspect, a microelectromechanical system (MEMS) device is presented. The MEMS includes a MEMS component in a device region of a device substrate. The device substrate has a top crystalline surface and a bottom crystalline surface. The MEMS device also includes a top cap defined with top cap inner and outer surfaces, and a bottom cap defined with bottom cap inner and outer surfaces. Both top and bottom cap inner surfaces include a recessed surface disposed in a central portion of the respective caps surrounded by non-recessed surfaces. The non-recessed surfaces of the top and bottom caps are fusion bond mated with the top and bottom surface of the device surrounding the device region to create top and bottom cavity over the device region.

In another aspect, a method of forming a MEMS device is disclosed. The method includes providing a device wafer having top and bottom device surfaces and the device wafer is processed with a MEMS component in a device region of the device substrate. The top and bottom device surfaces include device top and bottom cap bonding surfaces surrounding the device region respectively. The method also includes providing each top and bottom cap wafer with outer and inner cap surfaces such that the top and bottom inner cap surfaces have a recessed surface disposed in a central portion of the respective caps surrounded by non-recessed surfaces. The method further includes fusion bonding the non-recessed surfaces of the top and bottom caps with the top and bottom surface of the device surrounding the device region respectively such that one of the device top/bottom cap bonding surface or the top/bottom cap bonding surface includes a top silicon oxide surface, and other of the device top/bottom cap bonding surface or the top/bottom cap bonding surface includes a top crystalline surface.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the invention are described with reference to the following drawings, in which:

FIGS. 2a-2f show a process for forming top or bottom cap wafer of a MEMS device;

FIGS. 3a-3e show a process for forming a device wafer of a MEMS device; and

FIGS. 4a-4k show a process for forming a MEMS device.

DETAILED DESCRIPTION

Embodiments generally relate to microelectromechanical system (MEMS) devices. Generally, MEMS devices are processed in parallel on a wafer, such as a silicon wafer. Other types of wafers may also be used to form the MEMS devices. After processing, the wafer is diced to separate the devices.

Figure 1:
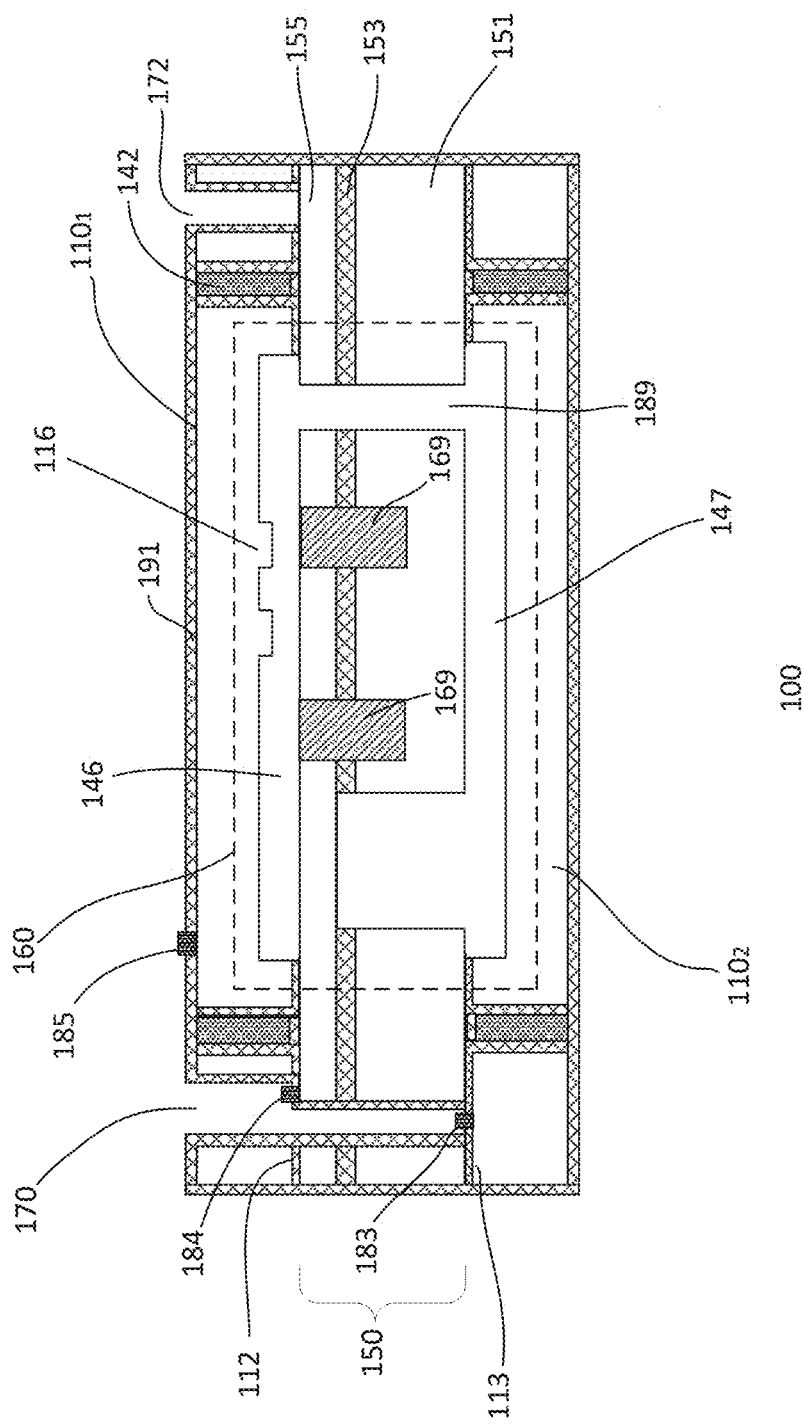
FIG. 1 shows an embodiment of an encapsulated microelectromechanical systems (MEMS) device.

FIG. 1 shows an embodiment of a microelectromechanical system (MEMS) device 100. In one embodiment, the device includes MEMS device substrate 150. The MEMS device substrate, for example, may be a crystalline-on-insulator (COI), such as a silicon-on-insulator (SOI) substrate. The SOI substrate includes a surface silicon substrate 155 and a bulk silicon substrate 151 separated by a buried oxide 153, such as silicon oxide. The bulk substrate may be referred to as a proof mass substrate. Other types of COI or non-COI substrates may also be used as the device substrate. The substrates may be doped substrates. For example, both the surface and bulk substrates may be doped. Providing non-doped substrates or a combination of doped and non-doped substrates may also be useful.

The device substrate includes a component region with a MEMS component 160. The MEMS component may be any type of MEMS components. For example, the MEMS component may be a sensor or a filter, such as a radio frequency (RF) filter. The device substrate includes first and second major surfaces. The first major surface may be referred to as the top surface and the second major surface may be referred to as the bottom surface. The substrate may be part of a wafer in which a plurality of MEMS devices are formed.

In an exemplary embodiment, the MEMS component includes an elongated component member. The component member may be a cantilever member attached to the substrate on a first end while the rest of the member is suspended. For example, the member is a patterned member which is part of the device substrate and separated by a release channel 189 surrounding the patterned member except for the first end. The member, for example, includes first and second portions. The first portion is proximate to the attached or first end and includes only the surface substrate. As for the second portion, which extends away from the first end, includes the bulk substrate, the BOX and the surface substrate. The second portion of the member includes conductive structures 169 which extend from the top surface of the surface substrate, through the BOX and partially into the bulk substrate. As shown, the second portion includes first and second conductive structures. The conductive structures, for example, include doped polysilicon conductive structures. The conductive structures, for example, couple the surface substrate to the proof mass.

The MEMS device includes a first cap $110_1$ disposed on the first major surface of the device substrate and a second cap $110_2$ disposed on the second major surface of the device substrate. The first cap may be referred to as the top cap and the second cap may be referred to as the bottom cap. For example, the top cap is disposed on the top surface of the device substrate and the bottom cap is disposed on the bottom surface of the substrate. The caps, for example, encapsulate the MEMS component, forming an encapsulated MEMS device. The caps may be doped silicon caps. The caps, for example, may be parts of cap wafers. In one embodiment, the top cap is part of a top cap wafer with a plurality of top caps and the bottom cap is part of a bottom cap wafer with a plurality of bottom caps. The cap wafers may be cap wafers, such as silicon cap wafers. Other types of cap wafers may also be useful.

The top cap includes an inner and an outer top cap surface. The inner top cap surface is the surface which faces the device substrate and the outer surface is the surface which is the opposite surface to the inner surface. For example, the outer top cap surface is exposed to the environment. The inner surface of the top cap includes a recessed surface. The recessed surface forms an upper cavity 146. The recessed surface, for example, encompasses the component region. Similarly, the bottom cap includes an inner and an outer bottom cap surface. The inner bottom cap surface faces the device substrate and the outer bottom cap surface is the opposite surface to the bottom cap inner surface. The inner surface of the bottom cap includes a recessed surface which forms a lower cavity 147. The upper and lower cavities enable movement of the MEMS component member. As shown, the inner surface of the top cap includes a pattern created by protrusions. Providing an inner surface which is smooth may also be useful.

The caps are bonded caps. In one embodiment, the bonded caps are fusion bonded caps. For example, the top cap is fusion bonded to the top surface of the device substrate and the bottom cap is fusion bonded to the bottom surface of the device substrate. In one embodiment, the top cap wafer is bonded to the top surface of the device substrate and the bottom cap is bonded to the bottom surface of the substrate. In one embodiment, the caps are bonded to the device substrate using fusion bonding. Fusion bonding, for example, involves bonding a silicon oxide surface, such as thermal oxide, with a crystalline surface, such as silicon. One of the surfaces of the cap or device substrate is silicon while the other is silicon oxide. In one embodiment, the bonding surface of the top cap includes silicon oxide 112, such as thermal oxide, and the bonding surface of the top surface of the device substrate is silicon; the bonding surface of the bottom cap includes silicon oxide 113 and the bonding surface of the bottom surface of the device substrate is silicon. Other configuration of bonding surfaces may also be useful.

In one embodiment, the top cap includes a via isolation region 142. The via isolation region extends a thickness of the top cap. In one embodiment, the via isolation region surrounds the perimeter of the device region in the top cap. The via isolation region includes a via which is lined with an insulation liner and filled with an insulator. The bottom of the insulator fill may be lined with the bonding oxide. The insulation liner may be silicon oxide and the insulator filling the via may be undoped polysilicon. Other types of insulation liners and insulators may also be useful. Similarly, the bottom cap includes a via insulation region 142 surrounding the perimeter of the device region. The top of the insulator may be lined with the bonding oxide. The via isolation regions serves to reduce parasitic leakage and parasitic capacitance.

The MEMS device includes a deep via opening 170. The deep via opening, for example, is disposed on a side of the MEMS device. The deep via opening, as shown, extends from the top cap, through the device substrate and to the bottom cap. The deep via opening includes steps to expose contact regions at the top surface of the device substrate and on the bottom cap. A metal contact 183 is disposed on the contact region on the inner surface of the bottom cap, a metal contact 184 is disposed on the contact region on the top device substrate surface and a metal contact 185 is disposed on the outer surface of the top cap. The MEMS device may also include a shallow via opening 172 on an opposite side as the deep via opening. The via openings, as well as the exposed surfaces of the MEMS device, are lined with an insulation liner 191. The insulation liner, for example, is thermal oxide.

The various wafers, such as the top cap wafer, bottom cap wafer and device wafer, are processed separately prior to bonding. After the different wafers are processed, they may be fusion bonded to form a wafer stack and processed to form encapsulated MEMS devices. The processed wafer stack is then diced to separate the encapsulated MEMS device.

FIGS. 2a-2f show a process 200 for forming a cap on a cap wafer. The process can be employed to form either a top cap or a bottom cap. For example, the process of forming a top cap or a bottom cap on a wafer is similar. In the case where the size of the cavity is different, different reticles may be employed. In the case where a cavity includes a pattern, additional mask and etch processes may be employed to form the cavity.

Referring to FIG. 2a, a cap wafer 210 is provided. As shown, the cap wafer has first and second surfaces 210a and 210b. The first surface, for example, may be referred to as an inner surface and the second surface may be referred to as an outer surface. The first or inner surface may serve as a bonding surface of the cap wafer. The cap wafer is a low resistance wafer, such as a low resistance silicon wafer. For example, the wafer may be heavily doped wafers. The wafers may be doped with second polarity type dopants, such as p-type dopants. Providing the cap wafer doped with n-type dopants may also be useful. It is understood that the top and bottom cap wafer need not be doped with the same polarity type dopants. Providing undoped cap wafers or a combination of doped and undoped cap wafers may also be useful, depending on the type of MEMS device.

A dielectric layer 222 is formed on the wafer. The dielectric layer, for example, is a silicon oxide layer. In one embodiment, the silicon layer is formed by thermal oxidation. The dielectric layer lines all surfaces of the wafer. For example, the dielectric layer lines the top surface, bottom surface and sides of the wafer. The oxide layer 222 serves as a hard mask.

A first alignment mark 231 is formed on the top surface of the wafer. The alignment mark serves as a lithography alignment mark for patterning successive lithography layers. To form the alignment mark, mask and etch techniques may be employed. For example, a photoresist layer is formed on the substrate and exposed with an exposure source through a reticle with the desired pattern. The photoresist is developed, transferring the desired pattern of the reticle to the resist. The pattern may include an opening which exposes the wafer in which the alignment mark is to be formed. An anisotropic etch, such as RIE, is performed using the photoresist as an etch mask to form an alignment trench. After forming the trench, the photoresist mask is removed and the trench is filled with an alignment mark material. The alignment mark material, for example, may be a dielectric, such as silicon oxide. Other types of alignment mark materials may also be useful. A planarizing process, such as chemical mechanical polish (CMP) is performed to remove excess alignment mark material, completing the process of forming the alignment mark. Although the alignment mark is shown as a single trench, it is understood that the alignment mark may include a plurality of trenches forming a specified alignment pattern. Other types of alignment marks may also be employed.

Referring to FIG. 2b, the edge of the top surface of the cap wafer is trimmed, forming a stepped edge 218. Trimming the edge prevents edge peeling and improves reliability of wafer bonding. In addition, trimming the edge reduces cracking which may occur from downstream back grinding of the wafer. After trimming the wafer edge, a second alignment mark 233 is formed. The second alignment mark serves as a wafer bonding alignment mark. The second alignment mark may be formed using mask and etch techniques, as previously described. The second alignment mark may be, for example, a dielectric alignment mark, such as silicon oxide. Although the second alignment mark is shown as a single trench, it is understood that the alignment mark may include a plurality of trenches forming a specified alignment pattern. Other types of alignment marks may also be employed.

Figure 2C:
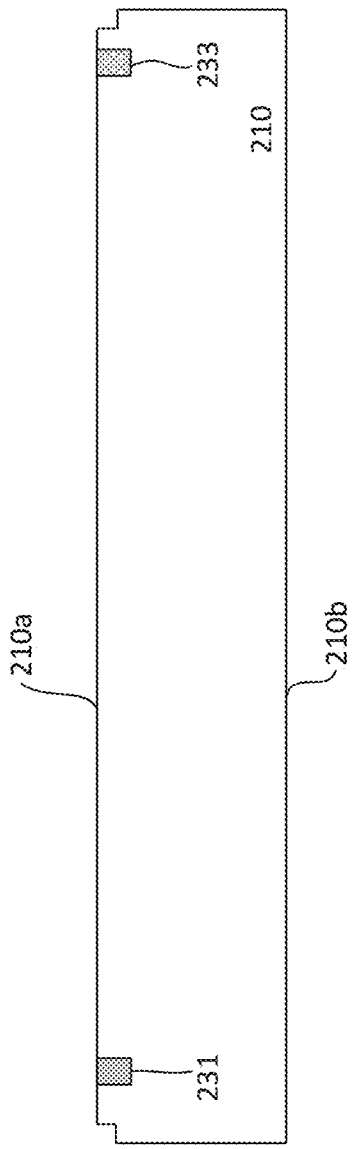

As shown in FIG. 2c, the dielectric layer is removed. The dielectric layer may be removed by, for example, a wet etch. Other techniques for removing the dielectric layer may also be useful. This leaves a bare cap wafer with the first and second alignment marks.

Figure 2D:
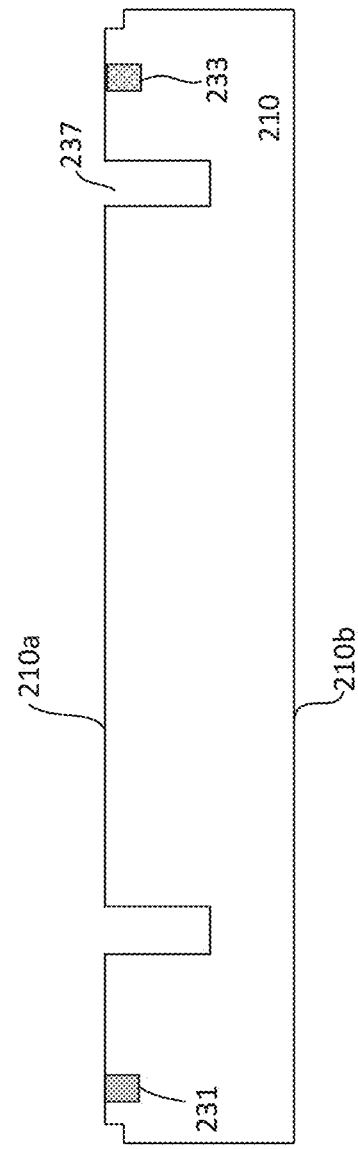

Referring to FIG. 2d, isolation via 237 is formed on the inner surface of the cap wafer. The isolation via, for example, surrounds a device region when the cap wafer is bonded to a device wafer. The isolation via may be formed using mask and etch techniques. For example, a patterned resist mask may serve as an etch mask for a RIE to form the isolation via. A depth of the isolation via should be slightly deeper than a final thickness of the cap wafer.

FIG. 2e shows the formation of a dielectric liner 238. The dielectric liner lines exposed surfaces of the cap wafer, including the isolation via. In one embodiment, the liner is a silicon oxide liner formed by thermal oxidation. An insulating material is formed on the wafer, filling the isolation via. The insulation fill material, in one embodiment, is polysilicon deposited by chemical vapor deposition (CVD). In one embodiment, the polysilicon fill is undoped to increase insulation properties. Other types of insulation fill materials may also be useful. A planarization process is performed to remove excess insulation fill material. The planarization process, in one embodiment, includes an etch back process. Other types of planarization processes, such as CMP, may also be employed. This forms a via isolation region 242.

After the via isolation region is formed, the dielectric liner may be removed. For example, a wet etch is performed to remove the dielectric liner, leaving a bare wafer with a via insulation region and alignment marks. A final dielectric layer 239 is formed on the cap wafer. The final dielectric layer, for example, is a thermal silicon oxide layer. The final dielectric layer covers all exposed surfaces of the wafer, such as the top, bottom and side surfaces of the wafer covered with the dielectric liner, including the top of the insulation fill of the via dielectric layer. The final dielectric layer should be sufficiently thick to enable fusion bonding with a device substrate. The final dielectric layer may have a thickness of about 1.1 μm. Other thicknesses may also be useful.

It is understood that the via isolation regions of the top and bottom cap wafers may have different depths or disposed in different locations. This can be achieved by using different reticles for the top and bottom cap wafers to form the via isolation regions. In addition, the depth can be tuned by adjusting the etch time of the isolation via as well as the amount of fill to ensure sufficient filling.

Referring to FIG. 2f, the cap wafer is processed to form a recess 249. The recess is formed on the inner surface of the cap wafer. The recess may be formed using mask and etch techniques. For example, a RIE using a patterned resist layer as an etch mask to form the recess. The recess serves as a cavity when the cap is bonded to a device wafer. In the case of a top cap wafer, the recess serves as a top cavity over the device region; in the case of a bottom cap wafer, the recess serves as a bottom cavity below the device region. The recess, for example, is surrounded by a non-recessed region of the cap wafer. The non-recessed region with the final dielectric layer may serve as a bonding surface of the cap wafer.

As discussed, the top and bottom caps may have different sized or shaped cavities. This can be easily achieved by using respective reticles for the top and bottom cap wafers to form the recess. In addition, as discussed, a cavity may include a patterned surface. In such cases, the recess may be partially formed using first mask and etch processes followed by second mask and etch processes to form the pattern.

For purpose of simplification, FIGS. 2a-2f have been described in the context of forming a signal cap on a cap wafer. It is understood that the cap wafer may include numerous caps which are bonded in alignment with a device wafer having a plurality of MEMS devices. The dielectric layer disposed on the inner surface of the cap wafer serves as the cap bonding regions for fusion bonding with a silicon surface of the device wafer.

FIGS. 3a-3e show an embodiment of a process 300 for forming a MEMS component of a MEMS device on a device wafer. Referring to FIG. 3a, a device wafer 350 is provided. The device wafer, in one embodiment, is a COI wafer, such as a SOI wafer. The SOI wafer includes a surface silicon wafer 355 and a bulk silicon wafer 351 separated by a buried oxide (BOX) 353. The wafers may be doped wafers. For example, both the surface and bulk wafers may be doped. Providing non-doped wafers or a combination of doped and non-doped wafers may also be useful. The SOI wafer may be provided as a SOI wafer or processed to form a SOI wafer. The wafer may be trimmed to form a stepped 368 at the edge of the wafer. For example, the edge of the surface substrate may be trimmed, forming the edge therein. The substrate may be a prepared SOI substrate with a trimmed edge. Alternatively, the SOI wafer may be processed to form the trimmed edge. Other types of device wafers, including non-trimmed wafers, may also be useful. The device wafer includes a top surface 370a, which is the exposed or top surface of the surface wafer, and a bottom surface 370b, which is the exposed or bottom surface of the bulk substrate.

A first sacrificial dielectric layer (not shown) may be formed on the surface of the surface wafer. The sacrificial dielectric layer, for example, may be a silicon oxide layer deposited on the surface of the surface wafer. The silicon oxide layer may be formed by plasma enhanced CVD (PECVD). Other techniques for forming the sacrificial dielectric layer may also be useful. The silicon oxide layer may be about 1 µm thick. Other thicknesses may also be useful.

In one embodiment, a backside of the device wafer is smoothened. The backside is an exposed surface of the bulk wafer. In one embodiment, CMP is performed on the backside of the device wafer. The CMP, for example, removes about 3 µm of the backside of the device substrate to provide a smooth surface. After CMP, the sacrificial dielectric layer on the surface of the surface wafer is removed. The sacrificial dielectric layer may be removed by a wet etch. Other techniques for removing the sacrificial dielectric layer may also be useful.

As shown in FIG. 3b, a second sacrificial dielectric layer 362 is formed on the device wafer. The second sacrificial dielectric layer may be a silicon oxide layer. The sacrificial dielectric layer covers exposed surfaces of the device wafer. In one embodiment, the second sacrificial dielectric layer is a thermal silicon oxide layer. The second sacrificial dielectric layer may serve as a hard mask for forming alignment marks and conductive MEMS structures.

As shown, first and second alignment marks 361 and 363 are formed on the bottom surface of the device wafer. The first alignment mark may serve as a lithographic alignment mark and the second alignment mark may serve as a wafer bonding alignment mark. The alignment marks may be formed as previously described. For example, mask, etch, fill and planarizing techniques may be employed. The alignment marks may be formed using the same or separate processes.

In one embodiment, as shown in FIG. 3c, conductive vias 367 are formed on the first surface of the device wafer. The conductive vias, for example, extend from the top surface wafer, through the BOX and partially into the bulk wafer. The conductive vias may be formed using mask and etch techniques, as previously described.

Referring to FIG. 3d, a conductive layer 369 is formed over the top surface of the device wafer. The conductive layer fills the via openings and covers the top surface of the device. For example, the conductive layer fills the via openings and covers the second sacrificial dielectric layer over the top surface of the device wafer. The conductive layer, for example, is a doped polysilicon layer formed by CVD. The doped polysilicon layer may be a heavily doped polysilicon layer. For example, the doped polysilicon layer may be a heavily doped n-type polysilicon layer. Providing a p-type doped polysilicon layer may also be useful. The polysilicon layer may be doped by in-situ doping. Other techniques for doping the polysilicon layer may also be useful. In one embodiment, excess conductive material is removed by a planarization process, such as an etch back. Planarizing the conductive material by CMP may also be useful.

Referring to FIG. 3e, the second sacrificial dielectric layer is removed. In one embodiment, a wet etch is performed to remove the second sacrificial dielectric layer. Removing the sacrificial dielectric layer by other techniques may also be useful. In one embodiment, the excess conductive material may be over planarized. For example, the conductive material is recessed in the via openings to a height equals to about the surface of the surface wafer. This results in the top of the conductive material being coplanar with a top surface of the surface wafer when the sacrificial layer is removed. In one embodiment, openings 373 and 374 are formed in the surface wafer. The openings, for example, facilitate in releasing the MEMS member of the MEMS component and also in forming a deep via opening for contacts of the MEMS device.

FIGS. 4a-4k show an embodiment of a process 400 of forming a MEMS device. The process employs a processed top cap wafer, bottom cap wafer and device wafer, as described in, for example, FIGS. 2a-2f and 3a-3e. Common elements may not be described or described in detail.

Referring to FIG. 4a, the top cap wafer 4101, such as one formed according to the process described by FIGS. 2a-f, and a device wafer, such as one formed according to the process described in FIGS. 3a-3e, are provided. Other types of top cap and device wafers may also be provided. As shown, the top cap wafer includes lithographic and bonding alignment marks 431 and 433, a via isolation region 442 and a recess. The device wafer includes lithographic and bonding alignment marks 431 and 433 on a bottom surface, conductive structures 469 extending from the surface of the surface wafer, through the BOX and partially into the bulk wafer, and partial deep via and release openings 472 and 473 disposed in the surface wafer.

The top cap and device wafer are fusion bonded together. For example, the silicon oxide bonding surface of the top cap is fusion bonded to the crystalline surface of the surface substrate, such as silicon. This forms a wafer stack with a top cap wafer bonded to the device wafer.

The top cap wafer and device wafer, when bonded, forms a top cavity 446 over the device region. In addition, the partial release opening in the device wafer is in communication with the top cavity. As for the partial deep via opening, it is disposed outside of the via isolation region in the top cap wafer. The wafer bonding alignment mark 433 may be used to align the top cap and device wafers for bonding. The wafer stack may be referred to as a partial wafer stack.

In FIG. 4b, a bottom surface protective dielectric layer 477 is formed on the bottom surface of the device wafer. The dielectric layer, for example, is a silicon oxide layer. In one embodiment, the dielectric layer is a silicon oxide layer formed by PECVD. For example, the dielectric layer is a PTEOS layer. Other types of dielectric layers may also be useful.

After forming the dielectric layer, the partial wafer stack is flipped, exposing the outer surface of the top cap wafer for processing. The processing includes grinding the outer surface of the top cap to reduce its thickness. In one embodiment, back grinding is performed to reduce the thickness of the top cap wafer. Back grinding is sufficient to expose the via isolation region 442. After back grinding, a top cap dielectric layer 478 is formed on the outer surface of the top cap wafer as shown in FIG. 4c. The top cap dielectric layer, for example, is a silicon oxide layer. In one embodiment, the dielectric layer is a silicon oxide layer formed by PECVD. For example, the dielectric layer is a PTEOS layer. Other types of dielectric layers may also be useful. In some embodiments, first and second alignment marks (not shown) may be formed on the back grinded surface of the top cap prior to forming the top cap dielectric layer. For example, lithography and wafer bonding alignments may be formed on the back grinded surface of the top cap prior to forming the top cap dielectric layer.

In FIG. 4d, the partial wafer stack structure is again flipped to expose the bottom surface of the device wafer. The bottom surface is back grinded to reduce the thickness of the device wafer. For example, the exposed surface of the bulk wafer of the device wafer is back grinded. Reducing the thickness of the device wafer may remove the alignment marks on the bottom surface of the device substrate.

Referring to FIG. 4e, the processing the device substrate of the partial wafer stack commences. In one embodiment, the processing includes releasing the component member of the MEMS device, forming the deep via opening and removing the bulk wafer from the first portion of the MEMS component. In one embodiment, an etch mask 495 is formed on the bottom surface of the device substrate. The etch mask, for example, is a photoresist layer. The photoresist layer is patterned, as previously described to form openings corresponding to processing the device substrate. For example, openings in the etch mask correspond to the first portion of the MEMS component, release channel and deep via opening.

Referring to FIG. 4f, an anisotropic etch, such as a RIE, is performed. The etch removes the exposed bulk wafer of the device wafer selective to the BOX. The etch, for example, stops on the BOX. This partially releases the MEMS component member, removes the bulk wafer in the first portion of the MEMS components and removes the upper bulk wafer portion of the deep via. In FIG. 4g, the process continues to remove the BOX exposed by the etch mask. For example, a dry etch removes the BOX selectively to silicon. This completes forming a release channel 489 to release the MEMS component member, removes the BOX in the first portion of the MEMS component and completes opening the deep via in the device substrate. Thereafter, the etch mask is removed by, for example, ashing. Other techniques for removing the etch mask may also be useful.

Figure 4H:
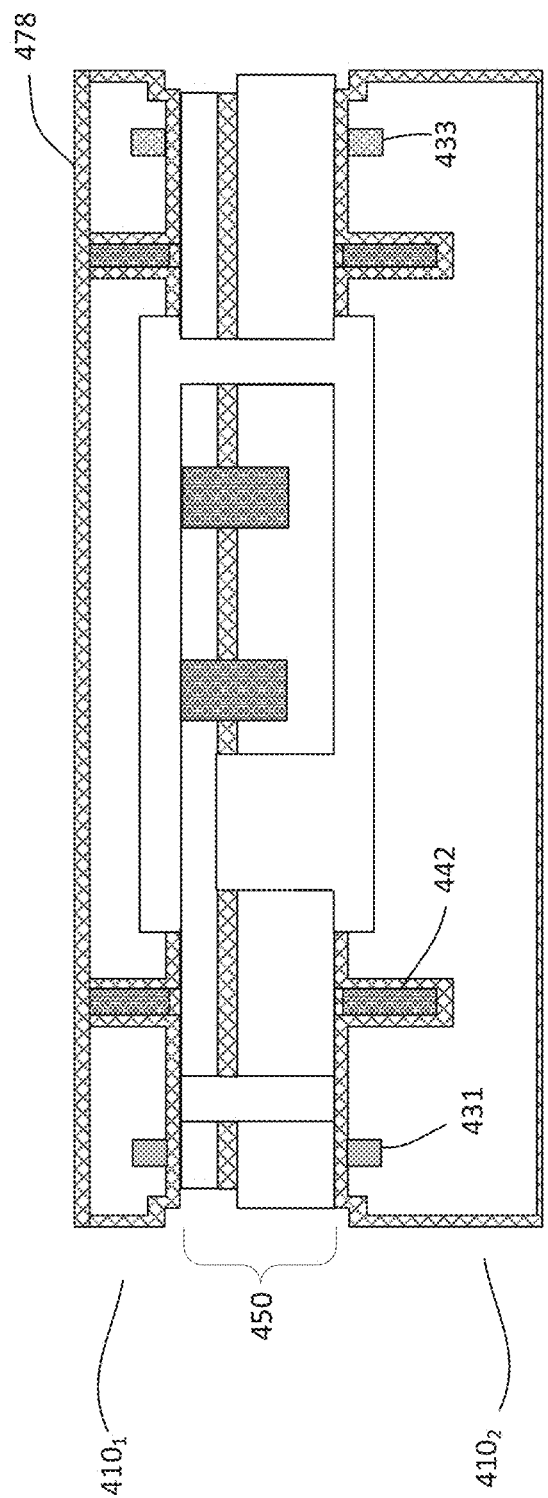

As shown in FIG. 4h, a bottom cap wafer 410$_2$, such as one formed according to the process described by FIGS. 2a-2f, is provided. As shown, the bottom cap wafer includes lithographic and bonding alignment marks 431 and 433, a via isolation region 442 and a recess. The bottom surface of the device wafer is prepared for bonding. For example, a hydrofluoric acid (HF) clean and pre-fusion bond clean, such as a megasonic clean may be performed. The bottom cap is then fusion bonded to the bottom surface of the device substrate, forming an encapsulated MEMS wafer stack. When bonded, the recess of the bottom cap forms a bottom cavity below the device region.

Figure 4I:
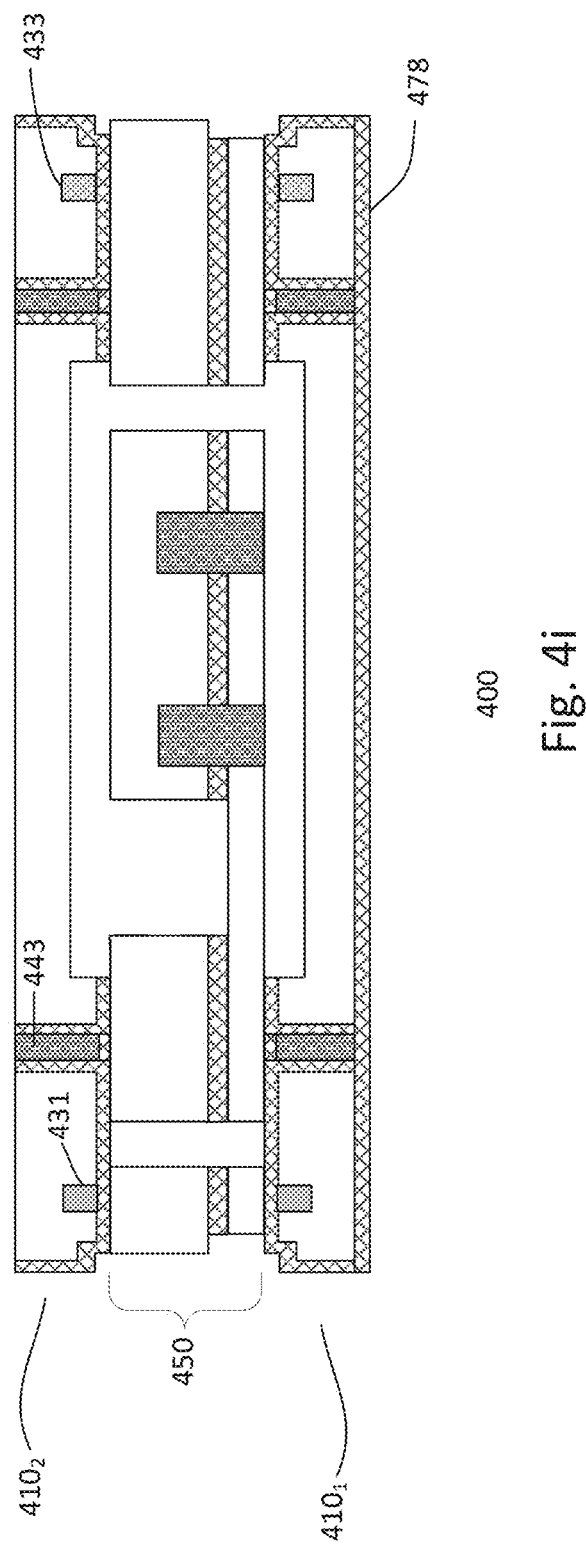

In FIG. 4i, the outer surface of the bottom cap wafer is back grinded to reduce its thickness. The back grinding is sufficient to expose the via isolation region 443. The process continues to complete forming the deep via and shallow via openings 470 and 472, as shown in FIG. 4j. To form the via openings, an etch mask 494 is formed on the outer surface of the top cap wafer. The etch mask includes openings corresponding to the deep and shallow via openings. An anisotropic etch, such as a RIE, is performed to remove the top cap material exposed by the etch mask. The etch, for example, is selective to oxide. As such, the etch stops at the dielectric layer that lined the inner surface of the top cap wafer. A second etch, such as a dry etch, etches the exposed oxide layer, completing the formation of the deep and shallow via openings.

Figure 4K:
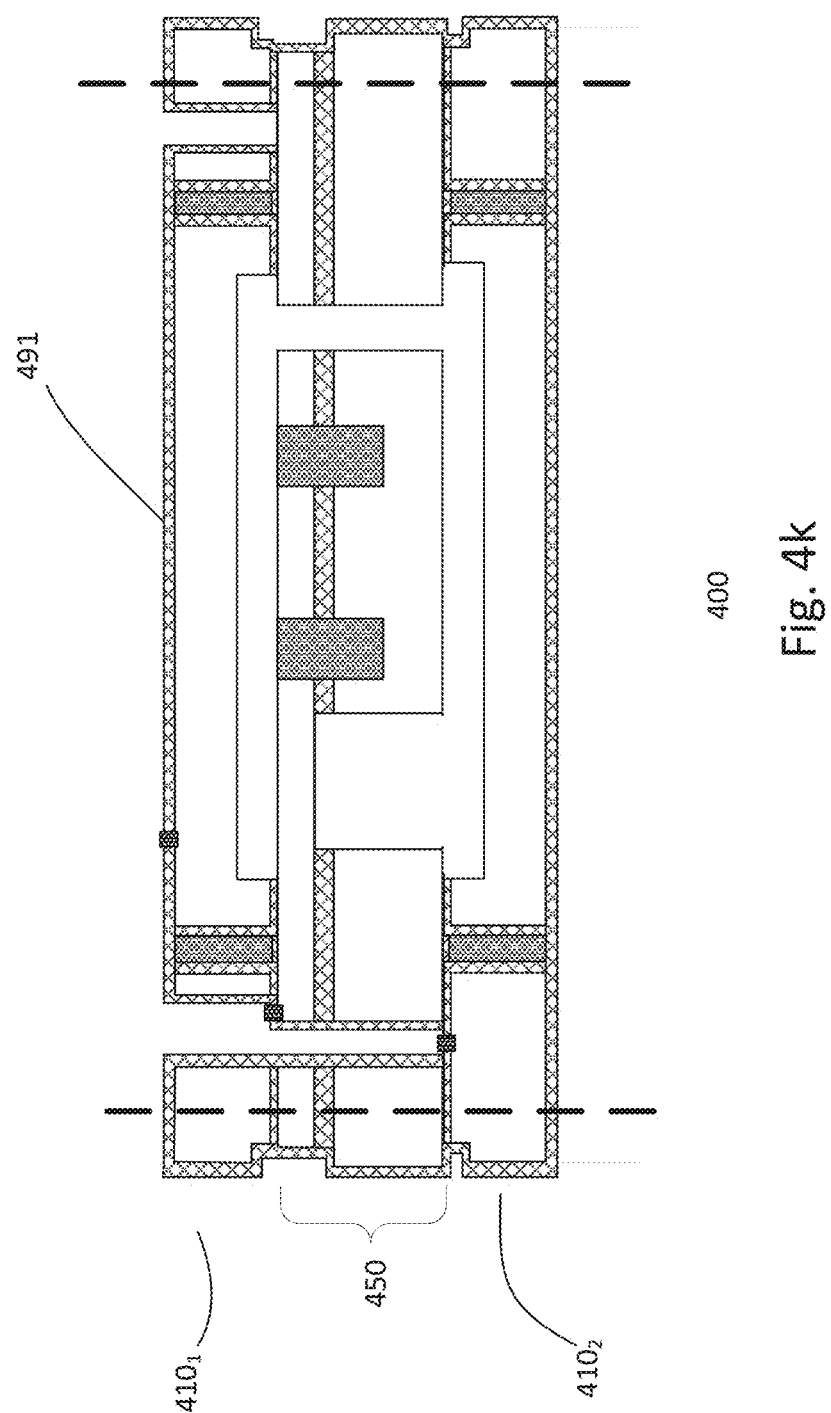

Referring to FIG. 4k, a wafer stack dielectric liner 491 is formed. The dielectric liner lines surfaces of the wafer stack. The dielectric liner may be a thermal oxide liner. Other types of liners may also be useful. The process continues to form metal contacts in the deep via opening to the bottom cap wafer, surface wafer of the device wafer and the top cap wafer. As discussed, the wafer stack includes a plurality of MEMS devices which are formed in parallel. After processing of the wafer stack has been completed, the wafer stack is diced, separating the MEMS devices into individual devices, as indicated by the dotted lines. As described, the MEMS device can be formed. The MEMS device, as described, can withstand very high temperature thermal process as well as being easily manufactured at the wafer level with excellent isolation and reduced parasitic and leakage paths.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method for forming a microelectromechanical system (MEMS) device comprising:
   providing a device wafer having a top device wafer surface and a bottom device wafer surface, wherein the device wafer comprises a MEMS component in a device region of the device wafer, a top device wafer bonding surface region on the top device wafer surface surrounding the device region and a bottom device wafer bonding surface region on the bottom device wafer surface surrounding the device region, and the top device wafer bonding surface region and the bottom device wafer bonding surface region comprise crystalline silicon;
   providing a top cap wafer having an outer top cap wafer surface and an inner top cap wafer surface;
   thermally oxidizing the inner top cap wafer surface to form a first silicon dioxide layer;
   after thermally oxidizing the inner top cap wafer surface, forming a first recess extending through the first silicon dioxide layer and into the top cap wafer to define a top cap wafer bonding region surrounding a top cap wafer device region that is recessed from the inner top cap wafer surface, wherein the top cap wafer bonding region is covered by the first silicon dioxide layer;
   providing a bottom cap wafer having an outer bottom cap wafer surface and an inner bottom cap wafer surface;
   thermally oxidizing the inner bottom cap wafer surface to form a second silicon dioxide layer;
   after thermally oxidizing the inner bottom cap wafer surface, forming a second recess extending through the second silicon dioxide layer and into the bottom cap wafer to define a bottom cap wafer bonding region surrounding a bottom cap wafer device region that is recessed from the inner bottom cap wafer surface, wherein the bottom cap wafer bonding region is covered by the second silicon dioxide layer;
   fusion bonding the crystalline silicon of the top device wafer bonding surface region to the first silicon dioxide layer on the top cap wafer bonding region;
   after fusion bonding the device wafer and the top cap wafer, forming a first opening penetrated throughout the device wafer;
   fusion bonding the crystalline silicon of the bottom device wafer bonding surface region to the second silicon dioxide layer on the bottom cap wafer bonding region; and
   after fusion bonding the device wafer and the bottom cap wafer, forming a second opening penetrated throughout the top cap wafer, wherein the first opening and the second opening completely forms a deep via opening extending from the outer top cap wafer surface to the bottom device wafer bonding surface region to simultaneously expose a portion of the top device wafer bonding surface region and a portion of the inner bottom cap wafer surface.

2. The method of claim 1 wherein the MEMS component includes a cantilever member, the top cap wafer device region and the bottom cap wafer device region create respective portions of a device cavity, and the cantilever member is located in the device cavity.

3. The method of claim 1 wherein the first opening exposes a contact region on the bottom cap wafer.

4. The method of claim 3 wherein the second opening exposes another contact region disposed on the device wafer.

5. The method of claim 1 wherein the bottom cap wafer includes a first via isolation in the bottom cap wafer bonding region, the first via isolation surrounds the bottom cap wafer device region, and the first via isolation extends through a thickness of the bottom cap wafer from the outer bottom cap wafer surface to the inner bottom cap wafer surface.

6. The method of claim 5 wherein the first via isolation surrounds the second recess.

7. The method of claim 5 wherein the first via isolation surrounds the bottom cap wafer device region.

8. The method of claim 5 wherein the top cap wafer includes a second via isolation in the top cap wafer bonding region, the second via isolation surrounds the top cap device region, and the second via isolation extends through a thickness of the top cap wafer from the outer top cap wafer surface to the inner top cap wafer surface.

9. The method of claim 8 wherein the second via isolation surrounds the first recess.

10. The method of claim 8 wherein the first via isolation surrounds the bottom cap wafer device region, and the second via isolation surrounds the top cap wafer device region.

11. The method of claim 5 wherein the first via isolation includes a via, an insulator core in the via, and an insulation liner between the insulator core and the via.

12. The method of claim 11 wherein the insulation liner contains silicon oxide, and the insulator core contains undoped polysilicon.

* * * * *